US010325934B2

(12) United States Patent
Jiang

(10) Patent No.: US 10,325,934 B2
(45) Date of Patent: Jun. 18, 2019

(54) DISPLAY SUBSTRATE, FABRICATING METHOD THEREOF, AND DISPLAY APPARATUS

(71) Applicants: BOE TECHNOLOGY GROUP CO., LTD., Beijing (CN); HEFEI XINSHENG OPTOELECTRONICS TECHNOLOGY CO., LTD., Hefei (CN)

(72) Inventor: Xuebing Jiang, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei (CN)

( * ) Notice: Subject to any disclaimer, the term of this patent is extended or adjusted under 35 U.S.C. 154(b) by 0 days.

(21) Appl. No.: 15/517,504

(22) PCT Filed: Jul. 1, 2016

(86) PCT No.: PCT/CN2016/088171
§ 371 (c)(1),
(2) Date: Apr. 6, 2017

(87) PCT Pub. No.: WO2017/133179
PCT Pub. Date: Aug. 10, 2017

(65) Prior Publication Data
US 2018/0323216 A1 Nov. 8, 2018

(30) Foreign Application Priority Data

Feb. 1, 2016 (CN) .......................... 2016 1 0070383

(51) Int. Cl.
*H01L 27/12* (2006.01)
*G02F 1/1368* (2006.01)
(Continued)

(52) U.S. Cl.
CPC .......... *H01L 27/124* (2013.01); *G02F 1/1345* (2013.01); *G02F 1/1368* (2013.01);
(Continued)

(58) Field of Classification Search
CPC ............... H01L 27/124; H01L 27/1262; G02F 1/13439; G02F 1/1345; G02F 1/13627; G02F 1/136286; G02F 1/1368
(Continued)

(56) References Cited

U.S. PATENT DOCUMENTS 9,252,159 B2    2/2016  Liu et al.
2005/0140903 A1* 6/2005  Park .................. G02F 1/134363
                                                          349/141
(Continued)

FOREIGN PATENT DOCUMENTS

CN     202159214 U    3/2012
WO    2016206452 A1   12/2016

OTHER PUBLICATIONS

1st Office Action dated Mar. 9, 2018 in CN201610070383.9.
International Search Report and Written Opinion dated Oct. 27, 2016 in PCT/CN2016/088171.

*Primary Examiner* — Long K Tran
(74) *Attorney, Agent, or Firm* — Syncoda LLC; Feng Ma

(57) ABSTRACT

The present disclosure provides a display substrate, a fabricating method thereof, and a display apparatus including the display substrate. The display substrate includes a plurality of data lines and a plurality of common electrode lines. Each data line extends substantially along a first direction, and each common electrode line is along the first direction, and is configured such that a common electrode signal along the each common electrode line is substantially uniform. Each common electrode line can be substantially parallel to one data line to thereby substantially avoid a pulling effect on the common electrode signal along the each common
(Continued)

electrode line caused by coupling between the each common electrode line and the one data line.

19 Claims, 6 Drawing Sheets

(51) Int. Cl.
*H01L 21/77* (2017.01)
*G02F 1/1343* (2006.01)
*G02F 1/1345* (2006.01)
*G02F 1/1362* (2006.01)
*G02F 1/136* (2006.01)

(52) U.S. Cl.
CPC .... *G02F 1/13439* (2013.01); *G02F 1/136227* (2013.01); *G02F 1/136286* (2013.01); *H01L 21/77* (2013.01); *H01L 27/12* (2013.01); *H01L 27/1262* (2013.01); *G02F 2001/13606* (2013.01); *G02F 2001/134372* (2013.01); *G02F 2001/136295* (2013.01)

(58) Field of Classification Search
USPC ..... 257/72; 438/48, 128, 149, 151, 157, 283
See application file for complete search history.

(56) References Cited

U.S. PATENT DOCUMENTS

| | | | |
|---|---|---|---|
| 2013/0044095 A1 | 2/2013 | Heo et al. | |
| 2014/0138718 A1* | 5/2014 | Liu | H01L 27/124 |
| | | | 257/88 |
| 2017/0148818 A1* | 5/2017 | Jia | G02F 1/136286 |

* cited by examiner

DISPLAY SUBSTRATE, FABRICATING METHOD THEREOF, AND DISPLAY APPARATUS

CROSS-REFERENCE TO RELATED APPLICATION

The present application claims priority to Chinese Patent Application No. 201610070383.9 filed on Feb. 1, 2016, the disclosure of which is hereby incorporated by reference in its entirety.

TECHNICAL FIELD

The present disclosure relates generally to a field of display technologies, and more specifically to a display substrate, a fabricating method thereof, and a display apparatus.

BACKGROUND

Current thin film transistor liquid crystal display devices (TFT-LCD) mainly include color film substrates and array substrates. An ADSDS (Advanced Super Dimension Switch) array substrate, for example, typically includes a substrate, gate lines, data lines, and common electrode lines, which are all disposed on the substrate. The gate lines and data lines cross to define pixel units, and each pixel unit includes a common electrode and a pixel electrode. The common electrode lines are typically arranged to surround the panel.

SUMMARY

The present disclosure provides a display substrate, a fabricating method thereof, and a display apparatus.

In one aspect, a display substrate is disclosed. The display substrate includes a plurality of data lines and a plurality of common electrode lines. Each data line extends substantially along a first direction, and each common electrode line is along the first direction, and is configured such that a common electrode signal along the each common electrode line is substantially uniform.

In some embodiments of the display substrate, each common electrode line is substantially parallel to one data line to thereby substantially avoid a pulling effect on the common electrode signal along the each common electrode line caused by coupling between the each common electrode line and the one data line.

The display substrate can further include a plurality of pixel units, which are arranged in rows and columns. Each pixel unit includes a common electrode, and each common electrode line is configured to separately control the common electrode in each of a column of the pixel units. As such, each common electrode line can be coupled to the common electrode in each of the column of the pixel units via a first switch.

The first switch can be a thin-film transistor (TFT), which includes a first gate electrode, a first source electrode, a first drain electrode, and a first active layer. The first source electrode and the first drain electrode are coupled to the first active layer; the first source electrode is coupled to the each common electrode line; and the first drain electrode is coupled to the common electrode.

The display substrate can further include a plurality of gate lines, and in some embodiments, the first gate electrode of the first switch comprises part of one gate line.

In some embodiments of the display substrate, the first drain electrode can be coupled to the common electrode through a first connection pattern and a second connection pattern. The first connection pattern is coupled to the common electrode; the first connection pattern is coupled to the second connection pattern; and the second connection pattern is coupled to the first drain electrode.

In some embodiments, each pixel unit further comprises a pixel electrode, and the display substrate can further include a passivation layer and a gate insulating layer. The first connection pattern is in a same layer as the gate lines and over the common electrode, and is coupled to the common electrode; the second connection pattern is in a same layer as the pixel electrode in each pixel unit, and is coupled to the first drain electrode through a first via above the first drain electrode and in the passivation layer; and the first connection pattern is coupled to the second connection pattern through a second via above the first connection pattern and in the gate insulating layer and the passivation layer.

Each data line can be coupled to the pixel electrode in each of a column of pixel units via a second switch. The second switch can be a thin-film transistor (TFT), which includes a second gate electrode, a second source electrode, a second drain electrode, and a second active layer. The second source electrode and the second drain electrode can be coupled to the second active layer; the second source electrode can be coupled to the each data line; and the second drain electrode can be coupled to the pixel electrode.

In some embodiments, the pixel electrode can be coupled to the second drain electrode through a third via above the second drain electrode and in the passivation layer. The passivation layer is over the data lines, the common electrode lines, the first source electrode, the first drain electrode, the second source electrode, and the second drain electrode. The gate insulating layer is above the gate lines and below the first source electrode, the first drain electrode, and the first active layer. The passivation layer is above the gate insulating layer.

The following embodiments are possible. The second gate electrode of the second switch can comprise part of one gate line. The common electrode can be disposed below the pixel electrode. The plurality of common electrode lines and the plurality of data lines can be on a same layer. Each common electrode line can be disposed between two adjacent data lines. The display substrate can further include an external control circuit coupled to the plurality of common electrode lines.

In another aspect, the present disclosure provides a display apparatus, which includes the display substrate according to any of the above-described embodiments.

In yet another aspect, the present disclosure provides a method for fabricating the display substrate according to any of the above-described embodiments. The method can include forming a plurality of data lines, a plurality of common electrode lines, a plurality of pixel units, and a plurality of gate lines over a substrate. Each common electrode line is arranged to be substantially parallel to one data line to thereby substantially avoid a pulling effect on the common electrode signal along the each common electrode line caused by coupling between the each common electrode line and the one data line; and each common electrode line is configured such that a common electrode signal along the each common electrode line is substantially uniform.

In some embodiments of the method, each pixel unit can include a common electrode and a pixel electrode. Each common electrode line can be coupled to a common electrode in each of a column of pixel units via a first switch, the first switch comprising a first gate electrode, a first source electrode, a first drain electrode, and a first active layer. Each data line can be coupled to a pixel electrode in each of a column of pixel units via a second switch, the second switch comprising a second gate electrode, a second source electrode, a second drain electrode, and a second active layer.

In some embodiment, the step of forming a plurality of data lines, a plurality of common electrode lines, a plurality of pixel units, and a plurality of gate lines over a substrate comprises the following sub-steps:

forming the common electrodes for the plurality of pixel units over the substrate;

forming the plurality of gate line and a first connection pattern over the substrate, wherein the first connection pattern is disposed over the common electrodes;

forming a gate insulating layer over the plurality of gate lines and the first connection pattern, wherein the gate insulating layer covers the substrate;

forming the first active layers and the second active layers over the gate insulating layer;

forming the plurality of data lines, the plurality of common electrode lines, the first source electrodes, the first drain electrodes, the second source electrodes, and the second drain electrodes over the substrate;

forming a passivation layer over the plurality of data lines, the plurality of common electrode line, the first source electrodes, the first drain electrodes, the second source electrodes, and the second drain electrodes, wherein the passivation layer covers the substrate;

forming first vias above the first drain electrodes and in the passivation layer, forming second vias above the first connection pattern and in the gate insulating layer and the passivation layer, and forming third vias above the second drain electrodes and in the passivation layer; and forming the pixel electrodes and the second connection pattern on the substrate, such that for each pixel unit, part of the pixel electrode is filled in the third via to connect with the second drain electrode, part of the second connection pattern is filled in the first via to connect with the first drain electrode, and part of the second connection pattern is filled in the second via to connect with the first connection pattern.

Other embodiments may become obvious in light of the embodiments as described above.

BRIEF DESCRIPTION OF DRAWINGS

To more clearly illustrate some of the embodiments, the following is a brief description of the drawings. The drawings in the following descriptions are only illustrative of some embodiments. For those of ordinary skill in the art, other drawings of other embodiments can become apparent based on these drawings.

DETAILED DESCRIPTION

In the following, with reference to the drawings of the embodiments disclosed herein, the technical solutions of the embodiments of the invention will be described in a clear and fully understandable way. It is noted that the described embodiments are merely a portion but not all of the embodiments of the invention. Based on the described embodiments of the invention, those ordinarily skilled in the art can obtain other embodiment(s), which come(s) within the scope sought for protection by the invention.

In a conventional ADSDS array substrate, gate lines, data lines and common electrode lines are all disposed on the substrate. The gate lines and data lines cross with each other to define pixel units, and each pixel unit includes a common electrode and a pixel electrode. The common electrode lines are arranged along the direction of the gate lines, and are directly connected to a plurality of common electrodes along the direction of the gate lines.

A display device having an array substrate of this above configuration have the following technical issues:

1) A common electrode line is directly connected to a plurality of common electrodes along the direction of a gate line so as to provide a common electrode signal to these common electrodes. Because resistance exists in the common electrode line itself, and the input point of the common electrode signal is arranged at one end of the common electrode line, the common electrode signals transmitted at different positions of the common electrode line are different. As such, the distribution of the common electrode signal on the common electrode line is not uniform, causing uneven flashes and liquid crystal polarization during displaying, which in turn leads to unsatisfactory residual display.

2) Because the common electrode lines are arranged in the direction of the gate lines, and the gate lines and the data lines cross with each other, so the common electrode lines and the data lines cross with each other. The coupling between the common electrode lines and data lines can have a pulling effect on the common electrode signals on the common electrode lines, resulting in reduced brightness in red pixels and blue pixels and increased brightness in green pixels, and ultimately leading to a greenish issue on the display.

Figure 1:
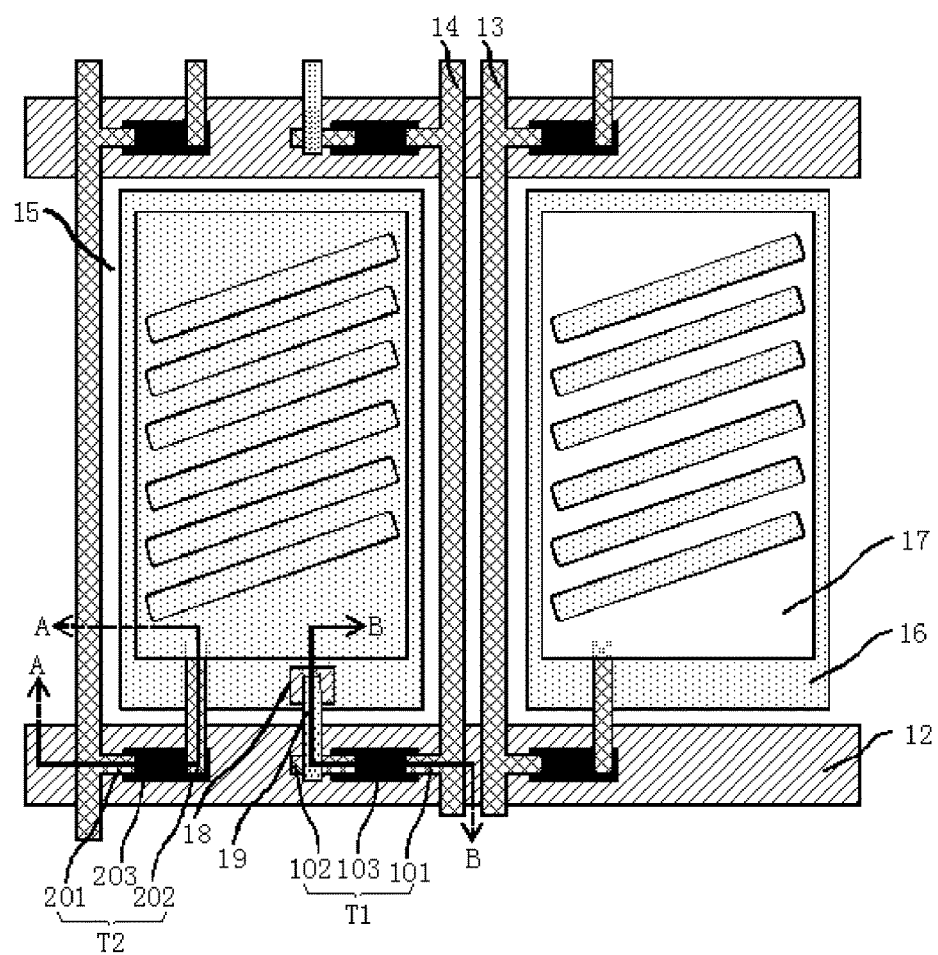
FIG. 1 is a schematic diagram of the structure of a display substrate according to some embodiments of the disclosure.
Figure 2:
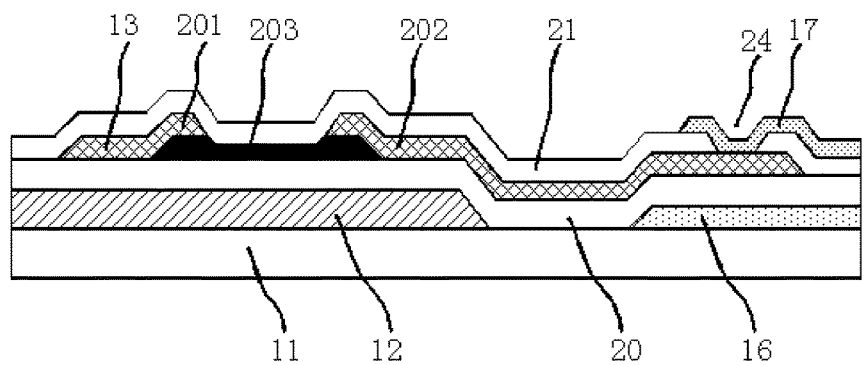
FIG. 2 is a cross-sectional view along the A-A direction in FIG. 1.
Figure 3:
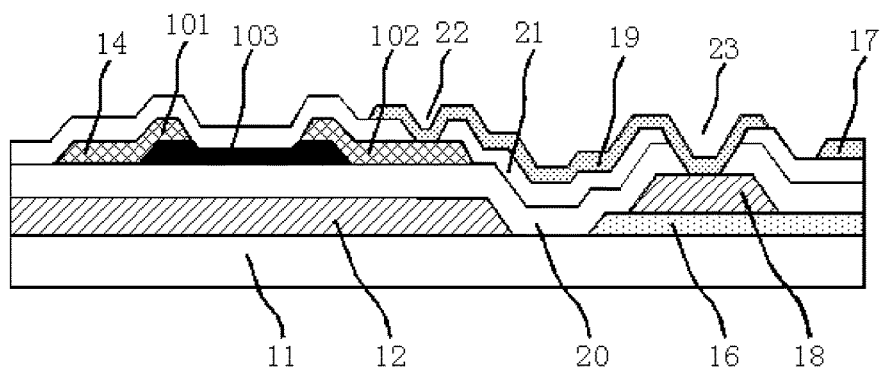
FIG. 3 is a cross-sectional view along the B-B direction in FIG. 1.

FIG. 1 is a schematic diagram of the structure of a display substrate according to some embodiments of the disclosure, and FIG. 2 and FIG. 3 are respectively the cross-sectional view along the A-A direction and along the B-B direction in FIG. 1. As shown in FIGS. 1-3, the display substrate includes: a substrate 11, gate lines 12, data lines 13, and common electrode lines 14. The gate lines 12, the data lines 13, and the common electrode lines 14 are disposed over the substrate 11. The gate lines 12 and the data lines 13 cross to define pixel units 15. Each of the pixel units 15 includes a common electrode 16 and a pixel electrode 17. The common electrode lines 14 are arranged along a direction of the data lines 13, and are connected to the common electrodes 16 through first switches T1.

In this embodiment, the common electrode lines 14 are arranged in parallel with the data lines 13, and the common electrode lines 14 and the data lines 13 are disposed on a same layer. Optionally, the common electrode lines 14 and the data lines 13 can be disposed on different layers.

In this embodiment, each common electrode line 14 corresponds to a column of common electrodes 16, and each of the column of common electrodes 16 is connected to the common electrode line 14 through a corresponding first switch T1. In some other embodiments, each of the common electrode lines can be disposed between adjacent data lines.

The gate lines 12 are arranged in rows and the data lines 13 are arranged in columns. The gate lines 12 and the data lines 13 cross to define pixel units 15. The pixel units 15 are arranged in a matrix, wherein the pixel units 15 are arranged in columns along the direction of the data lines 13 (i.e. the direction of the common electrode lines 14); in each column, a plurality of pixel units 15 are arranged in sequence, and as such, each column of the common electrodes 16 is arranged in a sequence. Each of the common electrode lines 14 corresponds to a column of common electrodes 16. Because each of the common electrode lines 14 needs to be connected with the common electrodes 16 in the corresponding column, a corresponding first switch T1 needs to be arranged for each common electrode 16, and thereby each common electrode 16 is connected to the common electrode line 14 via a corresponding first switch T1.

In this embodiment, although each common electrode line 14 is connected with a plurality of common electrodes 16, because each of the plurality of common electrodes 16 is connected with the common electrode line 14 through a first switch T1, through the first switch T1, the common electrode line 14 can thus separately input common electrode signal to the common electrode 16 connected to the first switch T1, thereby the common electrode line 14 can separately control each of the plurality of common electrodes 16.

In some embodiments, the common electrodes 16 are disposed below the pixel electrodes 17.

In the embodiment as shown in FIG. 1 and FIG. 3, a first connection pattern 18, which is in a same layer as the gate line 12, is disposed over the common electrode 16. The first switch T1 includes a first gate electrode, a first source electrode 101, a first drain electrode 102, and a first active layer 103. The first source electrode 101 and the first drain electrode 102 are both connected with the first active layer 103; the first source electrode 101 is connected with the common electrode line 14; the first drain electrode 102 is connected with the common electrode 16 through the first connection pattern 18 and a second connection pattern 19; and the second connection pattern 19 and the pixel electrode 17 are arranged in the same layer.

In some embodiment, part of the gate line 12 that corresponds to the first switch T1 serves as the first gate electrode. As such, the first gate electrode is not a separately arranged pattern, but rather the gate line 12 serves as the gate electrode, and the first active layer 103 is disposed directly above the gate line 12. By arranging the gate line as the gate electrode, the area occupied by the switches can be effectively reduced and saved.

The first source electrode 101 and the common electrode line 14 are integrated. The first source electrode 101 and the first drain electrode 102 are both disposed over the first active layer 103. The first drain electrode 102 is connected to the second connection pattern 19, the second connection pattern 19 is connected to the first connection pattern 18, and the first connection pattern 18 is connected to the common electrode 16. As such, the first drain electrode 102 is connected with the common electrode 16.

In the embodiment as shown in FIG. 1 and FIG. 2, the data line 13 is connected with the pixel electrode 17 through a second switch T2. The second switch T2 includes a second gate electrode, a second source electrode 201, a second drain electrode 202, and a second active layer 203. The second source electrode 201 and the second drain electrode 202 are connected with the second active layer 203; the second source electrode 201 is connected to the data line 13; and the second drain electrode 202 is connected to the pixel electrode 17.

In some embodiments, part of the gate line 12 that corresponds to the second switch T2 serves as the second gate electrode. As such, the second gate electrode is not a separately arranged pattern, but rather the gate line 12 serves as the gate electrode, and the second active layer 203 is disposed directly above the gate line 12. By arranging the gate line as the gate electrode, the area occupied by the switches can be effectively reduced and saved. The second source electrode 201 and the data line 13 are integrated.

In the embodiment as shown in FIG. 2 and FIG. 3, a gate insulating layer 20 is disposed over the gate line 12, and the gate insulating layer 20 covers the whole substrate 11. A passivation layer 21 is disposed over the data line 13, the common electrode line 14, the first source electrode 101, the first drain electrode 102, the second source electrode 201, and the second drain electrode 202, and the passivation layer 21 covers the whole substrate 11.

As shown in FIG. 3, the passivation layer 21 is provided with a first via 22; the first via 22 is arranged above the first drain electrode 102; and part of the second connection pattern 19 is filled in the first via 22 to thereby connect with the first drain electrode 102. The gate insulating layer 20 and the passivation layer 21 are provided with a second via 23; the second via 23 is disposed above the first connection pattern 18; and part of the second connection pattern 19 is filled in the second via 23 to thereby connect with the first connection pattern 18. As shown in FIG. 2, the passivation layer 21 is provided with a third via 24; the third via 24 is disposed above the second drain electrode 202; and part of the pixel electrode 17 is filled in the third via 24 to thereby connect with the second drain electrode 202.

In some embodiments, the first switch T1 and the second switch T2 that correspond to a same gate line 12 are configured to have a same scanning sequence. Herein the first switch T1 and the second switch T2 that correspond to a same gate line 12 refer to the first switch T1 and the second switch T2 that are controlled by the same gate line 12.

As shown in FIG. 1, each gate line 12 is connected with a plurality of first switches T1 and a plurality of second switches T2, and the gate line 12 thus controls the first switches T1 and the second switches T2 that are connected with it to open or close at the same time. As such, the scanning sequence whereby the same gate line 12 respectively controls the first switches T1 and the second switches T2 is the same.

In some embodiments, the common electrode lines can be connected with an external control circuit by bonding, and the external control circuit is configured to provide common electrode signals to the common electrode lines. The first switches and the second switches can be thin-film transistors (TFTs).

In some embodiments, the common electrode lines are arranged along the direction of the data lines, and the common electrode lines are connected to common electrodes through the first switches. Because each of the common electrodes is connected to the common electrode line through the first switches, the common electrode line can thus separately input common electrode signals to the common electrode connected to the first switch, thereby the common electrode line can separately control each of the common electrodes. As such, uneven distribution of the common electrode signals on the common electrode line can be avoided, and in turn uneven flashes and liquid crystal polarization can be further avoided, and ultimately the issue of unsatisfactory residual display can be avoided, and the transmittance of the panel can thus be improved.

Furthermore, the common electrode lines are arranged along the direction of the data lines, so the common electrode lines and the data lines do not cross, and as such, the pulling effects on the common electrode signals along the common electrode lines caused by coupling between the common electrode lines and the data lines can be avoided, and in turn the greenish issue on the display can be further avoided.

In some embodiments of the disclosure, a display apparatus is provided. The display apparatus includes a display substrate and an opposing substrate, facing against each other. The display substrate can be the display substrate according to the embodiments as described above. The display apparatus can be an ADSDS display apparatus, or an FFS (Fringe Field Switching) display apparatus.

In this embodiment of the display apparatus, common electrode lines are arranged along the direction of data lines, and the common electrode lines are connected to common electrodes through first switches. Because each of the common electrodes is connected to a common electrode line through the first switches, the common electrode line can thus separately input common electrode signals to the common electrode connected to the first switch, thereby the common electrode line can separately control each of the common electrodes.

As such, uneven distribution of the common electrode signals on the common electrode line can be avoided, and in turn uneven flashes and liquid crystal polarization can be further avoided, and ultimately the issue of unsatisfactory residual display can be avoided.

Furthermore, the common electrode lines are arranged along the direction of the data lines, so the common electrode lines and the data lines do not cross, and as such, the pulling effects on the common electrode signals along the common electrode lines caused by coupling between the common electrode lines and the data lines can be avoided, and in turn the greenish issue on the display can be further avoided.

Additionally, the common electrode lines are arranged along the direction of the data lines, and each of the common electrode lines is disposed between two neighboring columns of data lines. As such, the area occupied by the common electrode lines is reduced, in turn increasing the transmission rate of the display device, and benefit the realization of narrow borders.

In some embodiments of the disclosure, a method for fabricating a display substrate is provided. The method comprises: forming gate lines, data lines, common electrode lines, pixel electrodes, common electrodes and first switches over a substrate. The gate lines and the data lines cross to define pixel units; each of the pixel units includes one common electrode and one pixel electrode; the common electrode lines are arranged along the direction of the data lines; and each of the common electrode line is connected with the common electrodes through first switches.

Figure 4:
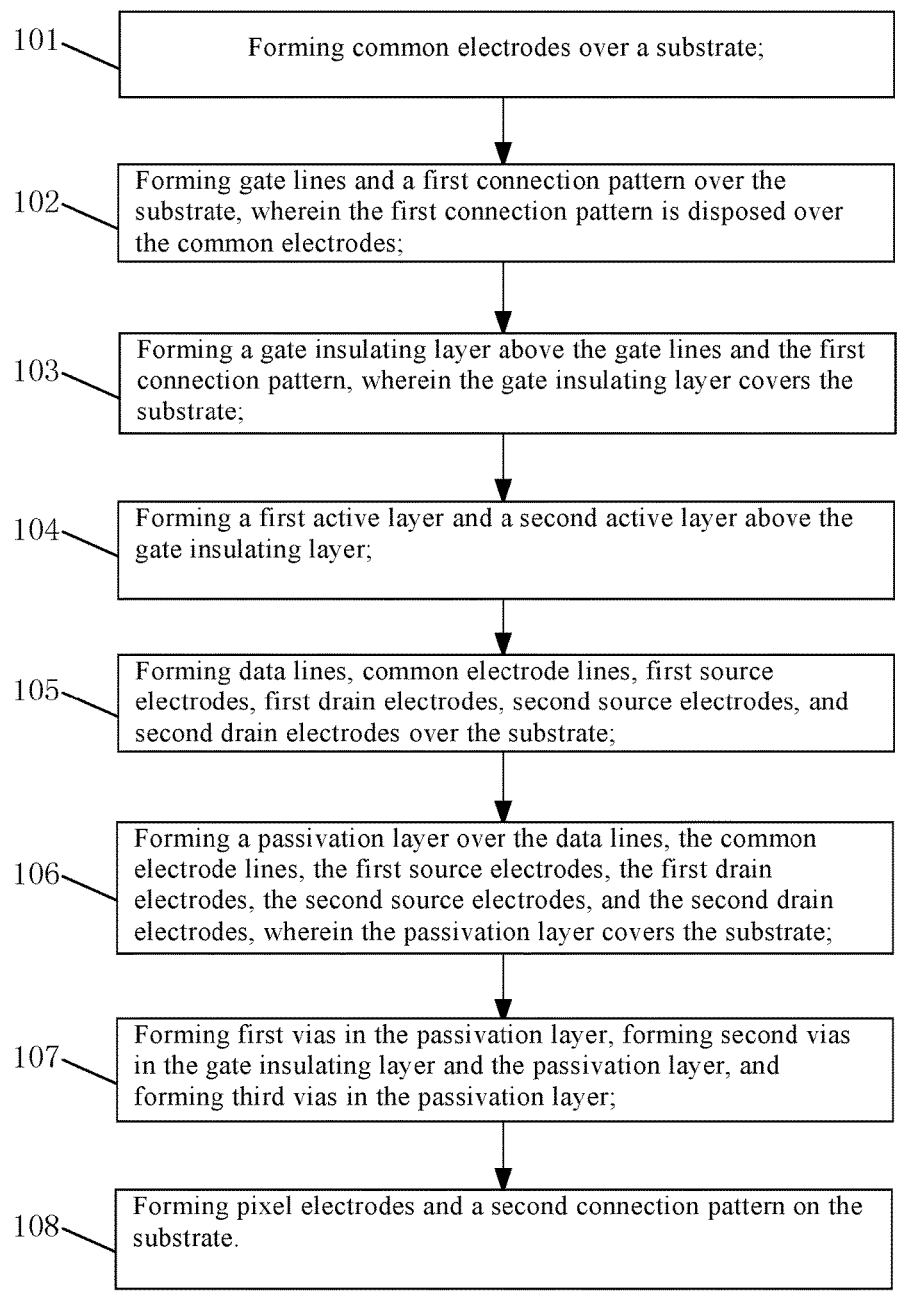
FIG. 4 illustrate a flow chart of the method for fabricating a display substrate according to some embodiments of the present disclosure.
Figure 5A:
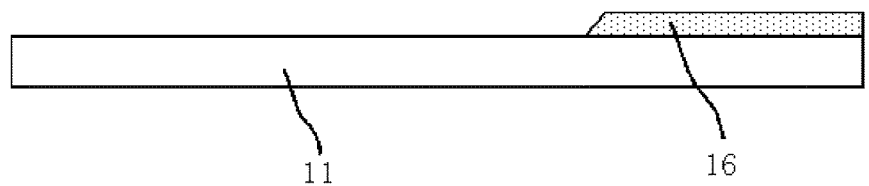
FIG. 5A is a schematic diagram of forming common electrodes in some embodiments of the disclosure.

The method for fabricating a display substrate as disclosed in some embodiments will be described in detail through a specific example. FIG. 4 illustrates a flow chart of the method for fabricating the display substrate according to some embodiments of the present disclosure. The method comprises:

Step 101: forming common electrodes over a substrate;

FIG. 5A is a schematic diagram of forming common electrodes in some embodiments of the disclosure. Specifically, a common electrode material layer is formed on the substrate 11, and the common electrode material layer is processed to form common electrodes 16 on the substrate 11 by patterning.

Figure 5B:
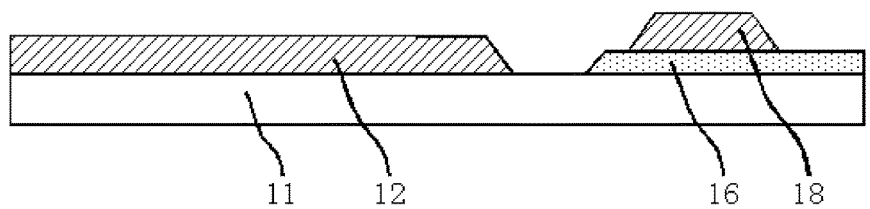
FIG. 5B is a schematic diagram of forming gate lines in some embodiments of the disclosure.

Step 102: forming gate lines and a first connection pattern over the substrate after Step 101, wherein the first connection pattern is disposed over the common electrodes;

FIG. 5B is a schematic diagram of forming gate lines in some embodiments of the disclosure. Specifically, a material for a gate electrode and a first connection pattern material layer is formed on the substrate after Step 101, a portion of the material for the gate electrode and the first connection pattern material layer is in direct contact with the substrate and another portion of the material is on the common electrode, the gate electrode and first connection pattern material layer is processed to form a gate line 12 and a first connection pattern 18 on the substrate 11 and on the common electrode 16 by patterning the gate electrode and first connection pattern material layer.

Figure 5C:
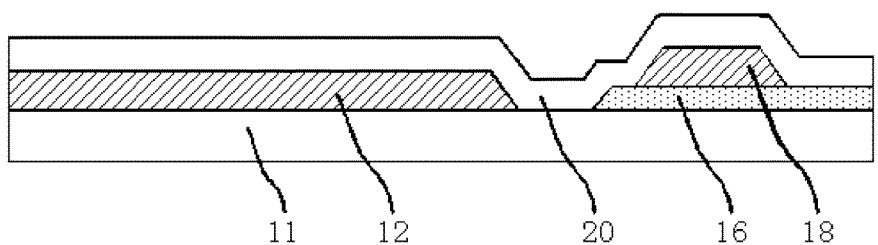
FIG. 5C is a schematic diagram of forming a gate insulating layer in some embodiments of the disclosure.

Step 103: forming a gate insulating layer above the gate lines and the first connection pattern, wherein the gate insulating layer covers the substrate;

FIG. 5C is a schematic diagram of forming a gate insulating layer in some embodiments of the disclosure. Specifically, a gate insulating layer 20 is deposited on the gate line 12 and the first connection pattern 18, so as to cover the whole substrate 11.

Figure 5D:
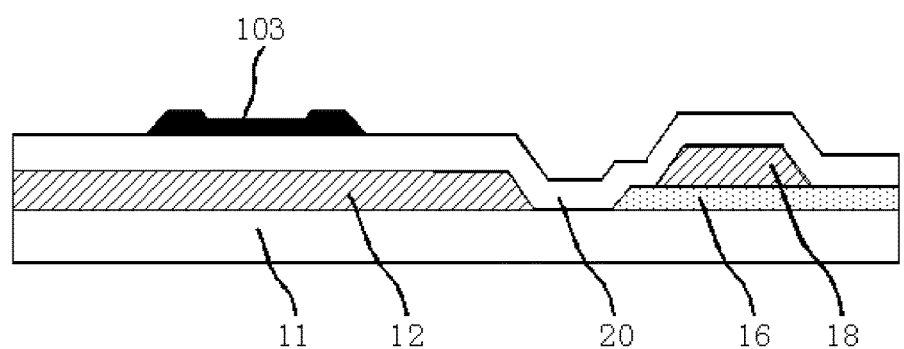
FIG. 5D is a schematic diagram of forming active layers in some embodiments of the disclosure.

Step 104: forming a first active layer and a second active layer above the gate insulating layer;

FIG. 5D is a schematic diagram of forming active layers in some embodiments of the disclosure. Specifically, an active material layer is formed on the gate insulating layer, and the active material layer is processed to form a first active layer 103 and a second active layer above the gate insulating layer 20 by patterning. The second active layer is not shown in FIG. 5D, and its details can be found in FIG. 1 and FIG. 2.

Figure 5E:
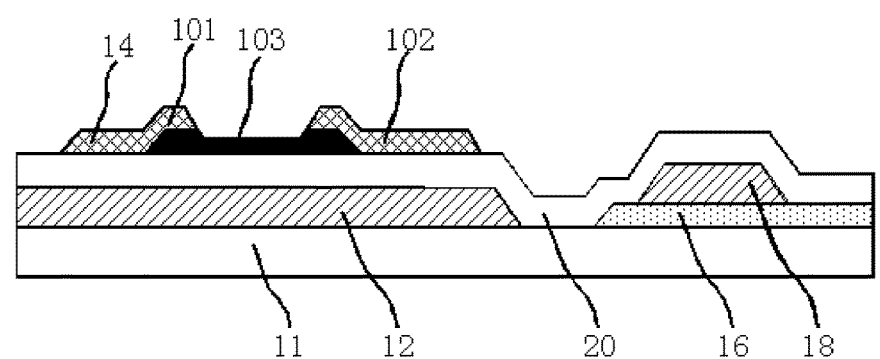
FIG. 5E is a schematic diagram of forming a source electrode and drain electrode layer in some embodiments of the disclosure.

Step 105: forming data lines, common electrode lines, first source electrodes, first drain electrodes, second source electrodes, and second drain electrodes over the substrate after Step 104;

FIG. 5E is a schematic diagram of forming a source electrode and drain electrode layer in some embodiments of the disclosure. Specifically, a source and drain material layer is formed on the substrate after Step 104, the source and drain material layer is processed to form data lines, common electrode lines 14, first source electrodes 101, first drain electrodes 102, second source electrodes, and second drain electrodes. Data lines, second source electrodes, and second drain electrodes are not shown in FIG. 5E, and their details can be found in FIG. 1 and FIG. 2.

Figure 5F:
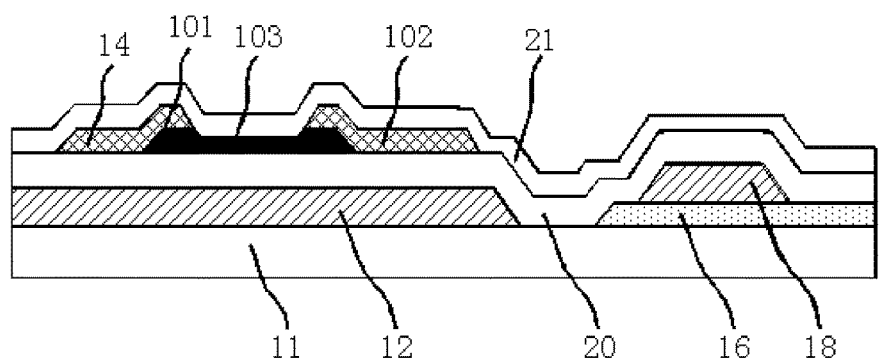
FIG. 5F is a schematic diagram of forming a passivation layer in some embodiments of the disclosure.

Step 106: forming a passivation layer over the data lines, the common electrode lines, the first source electrodes, the first drain electrodes, the second source electrodes, and the second drain electrodes, wherein the passivation layer covers the substrate;

FIG. 5F is a schematic diagram of forming a passivation layer in some embodiments of the disclosure. Specifically, a passivation layer 21 is deposited over the data lines, the common electrode lines, the first source electrodes, the first drain electrodes, the second source electrodes, and the second drain electrodes, such that the passivation layer 21 covers the substrate 11.

Figure 5G:
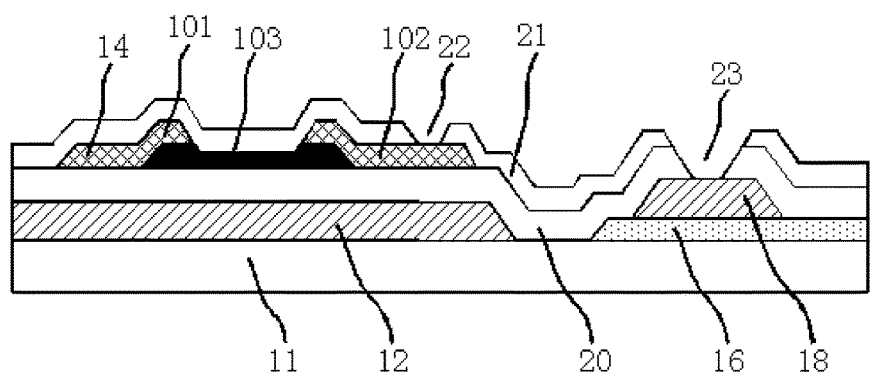
FIG. 5G is a schematic diagram of forming the first vias and the second vias in some embodiments of the disclosure.

Step 107: forming first vias on the passivation layer, forming second vias on the gate insulating layer and the passivation layer, and forming third vias on the passivation layer;

FIG. 5G is a schematic diagram of forming the first vias and the second vias in some embodiments of the disclosure. Specifically, the gate insulating layer 20 and the passivation layer 21 are processed by patterning such that first vias 22 are formed in the passivation layer, second vias 22 are formed in the gate insulating layer 20 and passivation layer 21, and third vias are formed in the passivation layer. The third vias are not shown in FIG. 5G, and their details can be found in FIG. 2.

Step 108: forming pixel electrodes and a second connection pattern on the substrate after step 107, such that part of the pixel electrodes are filled in the third vias to connect with the second drain electrodes, part of the second connection pattern is filled in the first vias to connect with the first drain electrodes, and part of the second connection pattern is filled in the second vias to connect with the first connection pattern.

Specifically, as shown in FIG. 3, a pixel electrode material layer is formed over the substrate 11 after step 107; the pixel electrode material layer is processed to form pixel electrodes 17 and a second connection pattern 19 on the substrate 11 after Step 107 by patterning; part of the pixel electrodes 17 are filled in the third vias to connect with the second drain electrodes; part of the second connection pattern 19 is filled in the first vias 22 to connect with the first drain electrodes 102, and part of the second connection pattern 19 is filled in the second vias 23 to connect with the first connection pattern 18. The third vias and the second drain electrodes are not shown in FIG. 3, their details can be found in FIG. 2.

In this embodiment, the patterning process can include photoresist coating, exposure, development, etching, photoresist stripping, etc.

The method for fabricating a display substrate as disclosed in this embodiment can be employed to manufacture the display substrate provided in some embodiments, and the description of the display substrate can be referenced to these embodiments.

In the method for fabricating a display substrate as disclosed herein, common electrode lines are arranged along the direction of data lines, and the common electrode lines are connected to common electrodes through first switches.

Because each of the common electrodes is connected to a common electrode line through a first switch, the common electrode line can thus separately input common electrode signals to the common electrode connected to the first switch, thereby the common electrode line can separately control each of the common electrodes. As such, uneven distribution of the common electrode signals on the common electrode line can be avoided, and in turn uneven flashes and liquid crystal polarization can be further avoided, and ultimately the issue of unsatisfactory residual display can be avoided.

Furthermore, the common electrode lines are arranged along the direction of the data lines, so the common electrode lines and the data lines do not cross, and as such, the pulling effects on the common electrode signals along the common electrode lines caused by coupling between the common electrode lines and the data lines can be avoided, and in turn the greenish issue on the display can be further avoided.

Additionally, the common electrode lines are arranged along the direction of the data lines, and each of the common electrode lines is disposed between two neighboring columns of data lines. As such, the area occupied by the common electrode lines is reduced, in turn increasing the transmission rate of the display device, and benefit the realization of narrow borders.

In addition, the common electrode lines and the data line can be formed in synchronization, each part of the first switches and each part of the second switches can be formed in synchronization. As such, there is no need to involve additional masks during exposure, and it can be achieved by just arranging mask patterns on the masks, so as not to increase the fabrication difficulty.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A display substrate, comprising:
   a substrate;
   a plurality of data lines, each extending substantially along a first direction;
   a plurality of pixel units arranged in the first direction and a second direction intersecting the first direction, each pixel unit comprising a common electrode and a pixel electrode;
   a material for a gate electrode and a first connection pattern material layer; wherein a portion of the material for the gate electrode and the first connection pattern material layer is in direct contact with the substrate, and another portion of the material is on the common electrode; and
   a plurality of common electrode lines;
   wherein:
      each common electrode line is along the first direction, and is configured such that a common electrode signal along the each common electrode line is substantially uniform;
      each common electrode line is coupled to the common electrode in each of the second direction of the pixel units via a first switch;
      the first switch comprises a thin-film transistor (TFT) having a first gate electrode, a first source electrode, a first drain electrode, and a first active layer;
      the first drain electrode is coupled to the common electrode through a first connection pattern and a second connection pattern; and
      the second connection pattern is in a same layer as the pixel electrode in each pixel unit.

2. The display substrate of claim 1, wherein each common electrode line is substantially parallel to one data line to thereby substantially avoid a pulling effect on the common electrode signal along the each common electrode line caused by coupling between the each common electrode line and the one data line.

3. The display substrate of claim 1, wherein the plurality of pixel units are arranged in rows and columns, and each common electrode line is configured to separately control the common electrode in each of a column of the pixel units.

4. The display substrate of claim 3, wherein:
the first source electrode and the first drain electrode are coupled to the first active layer;
the first source electrode is coupled to the each common electrode line; and
the first drain electrode is coupled to the common electrode.

5. The display substrate of claim 4, further comprising a plurality of gate lines, wherein the first gate electrode of the first switch comprises part of one gate line.

6. The display substrate of claim 4, wherein:
the first connection pattern is coupled to the common electrode;
the first connection pattern is coupled to the second connection pattern; and
the second connection pattern is coupled to the first drain electrode.

7. The display substrate of claim 6, wherein the display substrate further comprises a passivation layer and a gate insulating layer, wherein:
the first connection pattern is in a same layer as the gate lines and over the common electrode, and is coupled to the common electrode;
the second connection pattern is coupled to the first drain electrode through a first via above the first drain electrode and in the passivation layer; and
the first connection pattern is coupled to the second connection pattern through a second via above the first connection pattern and in the gate insulating layer and the passivation layer.

8. The display substrate of claim 7, wherein each data line is coupled to the pixel electrode in each of a column of pixel units via a second switch.

9. The display substrate of claim 8, wherein the second switch comprises a thin-film transistor (TFT), comprising a second gate electrode, a second source electrode, a second drain electrode, and a second active layer, wherein:
the second source electrode and the second drain electrode are coupled to the second active layer;
the second source electrode is coupled to the each data line; and
the second drain electrode is coupled to the pixel electrode.

10. The display substrate of claim 9, wherein:
the pixel electrode is coupled to the second drain electrode through a third via above the second drain electrode and in the passivation layer;
the passivation layer is over the data lines, the common electrode lines, the first source electrode, the first drain electrode, the second source electrode, and the second drain electrode;
the gate insulating layer is above the gate lines and below the first source electrode, the first drain electrode, and the first active layer; and
the passivation layer is above the gate insulating layer.

11. The display substrate of claim 9, wherein the second gate electrode of the second switch comprises part of one gate line.

12. The display substrate of claim 9, wherein the common electrode is below the pixel electrode.

13. The display substrate of claim 1, wherein the plurality of common electrode lines and the plurality of data lines are on a same layer.

14. The display substrate of claim 1, wherein each common electrode line is between two adjacent data lines.

15. The display substrate of claim 1, further comprising an external control circuit coupled to the plurality of common electrode lines.

16. A display apparatus, comprising a display substrate according to claim 1.

17. A method for fabricating a display substrate of claim 1, the method comprising:
forming a plurality of data lines each extending substantially along a first direction over a substrate;
forming a plurality of pixel units over the substrate arranged in the first direction and a second direction intersecting the first direction over the substrate, each pixel unit comprising a common electrode and a pixel electrode; and
forming a plurality of common electrode lines over the substrate; wherein:
each common electrode line is configured such that a common electrode signal along the each common electrode line is substantially uniform;
each common electrode line is coupled to the common electrode in each of the pixel units in the second direction via a first switch;
the first switch comprises a thin-film transistor (TFT) having a first gate electrode, a first source electrode, a first drain electrode, and a first active layer;
the first drain electrode is coupled to the common electrode through a first connection pattern and a second connection pattern; and
the second connection pattern is in a same layer as the pixel electrode in each pixel unit.

18. The method of claim 16, wherein:
each data line is coupled to a pixel electrode in each of a column of pixel units via a second switch, the second switch comprising a second gate electrode, a second source electrode, a second drain electrode, and a second active layer.

19. The method of claim 18, further comprising a plurality of gate lines over the substrate, wherein the forming the plurality of data lines, the plurality of common electrode lines, the plurality of pixel units, and the plurality of gate lines over the substrate further include:
forming the common electrodes for the plurality of pixel units over the substrate;
forming the plurality of gate lines and the first connection pattern over the substrate including: forming a material for a gate electrode and a first connection pattern material layer on the substrate; a portion of the material for the (late electrode and the first connection pattern material layer is processed to form a (late line and a first connection pattern on the substrate and on the common electrode by patterning the gate electrode and first connection pattern material layer, wherein the first connection pattern is disposed over the common electrodes;
forming a gate insulating layer over the plurality of gate lines and the first connection pattern, wherein the gate insulating layer covers the substrate;
forming the first active layers and the second active layers over the gate insulating layer;
forming the plurality of data lines, the plurality of common electrode lines, the first source electrodes, the first drain electrodes, the second source electrodes, and the second drain electrodes over the substrate;

forming a passivation layer over the plurality of data lines, the plurality of common electrode line, the first source electrodes, the first drain electrodes, the second source electrodes, and the second drain electrodes, wherein the passivation layer covers the substrate;

forming first vias above the first drain electrodes and in the passivation layer, forming second vias above the first connection pattern and in the gate insulating layer and the passivation layer, and forming third vias above the second drain electrodes and in the passivation layer; and forming the pixel electrodes and the second connection pattern on the substrate, such that for each pixel unit, part of the pixel electrode is filled in the third via to connect with the second drain electrode, part of the second connection pattern is filled in the first via to connect with the first drain electrode, and part of the second connection pattern is filled in the second via to connect with the first connection pattern.

* * * * *